(12) United States Patent
Goto et al.

(10) Patent No.: US 12,525,951 B2
(45) Date of Patent: Jan. 13, 2026

(54) SURFACE ACOUSTIC WAVE DEVICE HAVING A TRAPEZOIDAL ELECTRODE

(71) Applicant: Skyworks Solutions, Inc., Irvine, CA (US)

(72) Inventors: Rei Goto, Osaka (JP); Keiichi Maki, Suita (JP); Yuya Hiramatsu, Neyagawa (JP)

(73) Assignee: Skyworks Solutions, Inc., Irvine, CA (US)

( * ) Notice: Subject to any disclaimer, the term of this patent is extended or adjusted under 35 U.S.C. 154(b) by 336 days.

(21) Appl. No.: 17/936,773

(22) Filed: Sep. 29, 2022

(65) Prior Publication Data

US 2023/0107376 A1    Apr. 6, 2023

Related U.S. Application Data

(60) Provisional application No. 63/251,266, filed on Oct. 1, 2021.

(51) Int. Cl.
*H03H 9/64* (2006.01)
*H03H 9/02* (2006.01)
*H03H 9/145* (2006.01)

(52) U.S. Cl.
CPC .... *H03H 9/14558* (2013.01); *H03H 9/02992* (2013.01); *H03H 9/6483* (2013.01)

(58) Field of Classification Search
None
See application file for complete search history.

(56) References Cited

U.S. PATENT DOCUMENTS

| | | | |
|---|---|---|---|
| 5,646,584 | A | 7/1997 | Kondratyev et al. |
| 5,895,996 | A | 4/1999 | Takagi et al. |
| 7,230,512 | B1 | 6/2007 | Carpenter et al. |
| 7,352,104 | B2 | 4/2008 | Yamazaki et al. |
| 7,554,242 | B2 | 6/2009 | Aoki et al. |
| 8,294,331 | B2 | 10/2012 | Abbott et al. |

(Continued)

FOREIGN PATENT DOCUMENTS

| | | |
|---|---|---|
| CN | 113098432 A | 7/2021 |
| FR | 3105894 A1 | 7/2021 |

(Continued)

OTHER PUBLICATIONS

Iwamoto et al., "Transverse Modes in I.H.P. SAW Resonator and Their Suppression Method", Murata Manufacturing co., Ltd., (2018).

(Continued)

*Primary Examiner* — Idowu O Osifade
(74) *Attorney, Agent, or Firm* — Knobbe, Martens, Olson & Bear, LLP

(57) ABSTRACT

A surface acoustic wave device can have a piezoelectric layer and at least one interdigital transducer electrode thereon with a trapezoidal shape. This can be useful to fill dead space or voids between nonparallel elements on the layer. For example, an array with ranks of slanted interdigital transducer electrodes may not be aligned with non-slanted elements (e.g., a surface acoustic wave filter). This can leave voids or openings with unused portions of the piezoelectric layer. Trapezoidal elements such as those described here can solve this problem and help suppress transverse modes.

21 Claims, 14 Drawing Sheets

(56) References Cited

U.S. PATENT DOCUMENTS

| | | | |
|---|---|---|---|
| 8,741,683 B2 | 6/2014 | Huang et al. | |
| 9,065,424 B2 | 6/2015 | Nakanishi et al. | |
| 9,124,240 B2 | 9/2015 | Shimizu et al. | |
| 9,136,458 B2 | 9/2015 | Komatsu et al. | |
| 9,257,960 B2 | 2/2016 | Ruile et al. | |
| 9,413,330 B2 | 8/2016 | Shimizu et al. | |
| 9,419,584 B2 | 8/2016 | Tsurunari et al. | |
| 9,438,201 B2 | 9/2016 | Hori et al. | |
| 9,537,464 B2 | 1/2017 | Yamanaka | |
| 9,640,750 B2 | 5/2017 | Nakanishi et al. | |
| 9,641,152 B2 | 5/2017 | Nakamura et al. | |
| 9,673,779 B2 | 6/2017 | Ruile et al. | |
| 9,748,923 B2 | 8/2017 | Kando et al. | |
| 9,748,924 B2 | 8/2017 | Komatsu et al. | |
| 10,090,825 B2 | 10/2018 | Kuroyanagi | |
| 10,153,748 B2 * | 12/2018 | Tanaka | H03H 9/14594 |
| 10,361,678 B2 | 7/2019 | Iwaki et al. | |
| 10,476,470 B2 | 11/2019 | Takamine | |
| 10,483,942 B2 | 11/2019 | Goto et al. | |
| 10,574,207 B2 | 2/2020 | Yoon et al. | |
| 10,727,844 B1 | 7/2020 | Gong et al. | |
| 10,749,497 B2 | 8/2020 | Tang et al. | |
| 10,826,507 B1 | 11/2020 | Gong et al. | |
| 10,873,313 B2 | 12/2020 | Zou et al. | |
| 11,050,406 B2 | 6/2021 | Maki et al. | |
| 11,095,266 B2 | 8/2021 | Inoue et al. | |
| 11,165,411 B2 | 11/2021 | Liu et al. | |
| 11,239,817 B2 | 2/2022 | Hatano | |
| 11,245,378 B2 | 2/2022 | Tang et al. | |
| 11,296,672 B2 | 4/2022 | Hiratsuka et al. | |
| 11,368,137 B2 | 6/2022 | Goto et al. | |
| 11,522,514 B2 | 12/2022 | Zou et al. | |
| 11,606,078 B2 | 3/2023 | Tang et al. | |
| 11,616,491 B2 | 3/2023 | Tang et al. | |
| 11,677,380 B2 | 6/2023 | Fujiwara et al. | |
| 11,722,122 B2 | 8/2023 | Goto et al. | |
| 11,750,172 B2 | 9/2023 | Goto et al. | |
| 11,824,515 B2 | 11/2023 | Tang et al. | |
| 11,962,283 B2 | 4/2024 | Zou et al. | |
| 12,040,784 B2 | 7/2024 | Tang et al. | |
| 12,047,053 B2 | 7/2024 | Maki et al. | |
| 2004/0222717 A1 | 11/2004 | Matsuda et al. | |
| 2005/0077982 A1 | 4/2005 | Funasaka | |
| 2008/0018417 A1 | 1/2008 | Igaki et al. | |
| 2010/0265010 A1 | 10/2010 | Jian | |
| 2012/0049968 A1 | 3/2012 | Owaki et al. | |
| 2014/0285287 A1 | 9/2014 | Komatsu et al. | |
| 2014/0339957 A1 | 11/2014 | Tajima et al. | |
| 2016/0294361 A1 | 10/2016 | Yamane et al. | |
| 2017/0063332 A1 | 3/2017 | Gilbert et al. | |
| 2017/0099043 A1 | 4/2017 | Goto et al. | |
| 2017/0104470 A1 | 4/2017 | Koelle et al. | |
| 2017/0214385 A1 | 7/2017 | Bhattacharjee | |
| 2017/0214386 A1 | 7/2017 | Kido | |
| 2017/0222618 A1 | 8/2017 | Inoue et al. | |
| 2017/0250669 A1 | 8/2017 | Kuroyanagi et al. | |
| 2017/0272051 A1 | 9/2017 | Kurihara et al. | |
| 2017/0273183 A1 | 9/2017 | Kawasaki et al. | |
| 2017/0288629 A1 | 10/2017 | Bhattacharjee et al. | |
| 2017/0359048 A1 | 12/2017 | Yasuda | |
| 2018/0013404 A1 | 1/2018 | Kawasaki et al. | |
| 2018/0048290 A1 | 2/2018 | Sekine et al. | |
| 2018/0097501 A1 | 4/2018 | Kikuchi et al. | |
| 2018/0097508 A1 | 4/2018 | Iwamoto et al. | |
| 2018/0138893 A1 | 5/2018 | Caron | |
| 2018/0316329 A1 | 11/2018 | Guenard et al. | |
| 2018/0367119 A1 | 12/2018 | Lee | |
| 2019/0288661 A1 | 9/2019 | Akiyama et al. | |
| 2019/0319772 A1 | 10/2019 | Ando et al. | |
| 2019/0379347 A1 | 12/2019 | Goto et al. | |
| 2020/0036362 A1 | 1/2020 | Daimon | |
| 2020/0067482 A1 | 2/2020 | Maki et al. | |
| 2020/0106420 A1 | 4/2020 | Kodama et al. | |
| 2020/0144984 A1 | 5/2020 | Fukuhara et al. | |
| 2020/0212875 A1 | 7/2020 | Goto et al. | |
| 2020/0212883 A1 | 7/2020 | Goto et al. | |
| 2020/0220522 A1 | 7/2020 | Nosaka | |
| 2020/0358424 A1 | 11/2020 | Kaneda et al. | |
| 2020/0366268 A1 | 11/2020 | Goto et al. | |
| 2020/0366270 A1 | 11/2020 | Matsuoka | |
| 2020/0389151 A1 | 12/2020 | Goto | |
| 2021/0050842 A1 | 2/2021 | Tang et al. | |
| 2021/0058057 A1 | 2/2021 | Goto et al. | |
| 2021/0126616 A1 | 4/2021 | Hiramatsu et al. | |
| 2021/0167748 A1 | 6/2021 | Huck et al. | |
| 2021/0297060 A1 | 9/2021 | Omura et al. | |
| 2022/0014152 A1 | 1/2022 | Gebeyehu et al. | |
| 2022/0014175 A1 | 1/2022 | Nagatomo et al. | |
| 2022/0077840 A1 | 3/2022 | Caron | |
| 2022/0109419 A1 * | 4/2022 | Esquius Morote | H03H 9/725 |
| 2022/0209738 A1 | 6/2022 | Torazawa et al. | |
| 2022/0271730 A1 | 8/2022 | Abbott et al. | |
| 2022/0271733 A1 | 8/2022 | Abbott et al. | |
| 2022/0271734 A1 | 8/2022 | Abbott et al. | |
| 2022/0328980 A1 | 10/2022 | Dicarlo et al. | |
| 2022/0360249 A1 | 11/2022 | Ballandras et al. | |
| 2022/0399867 A1 | 12/2022 | Goto et al. | |
| 2022/0399871 A1 | 12/2022 | Goto et al. | |
| 2023/0013597 A1 | 1/2023 | Goto et al. | |
| 2023/0016884 A1 | 1/2023 | Goto et al. | |
| 2023/0026465 A1 | 1/2023 | Huang et al. | |
| 2023/0031568 A1 | 2/2023 | Tang et al. | |
| 2023/0032325 A1 | 2/2023 | Goto et al. | |
| 2023/0039507 A1 | 2/2023 | Kim et al. | |
| 2023/0104405 A1 | 4/2023 | Hiramatsu et al. | |
| 2023/0105726 A1 | 4/2023 | Tang et al. | |
| 2023/0109106 A1 | 4/2023 | Hiramatsu et al. | |
| 2023/0112677 A1 | 4/2023 | Tang et al. | |
| 2023/0208385 A1 | 6/2023 | Hiramatsu et al. | |
| 2023/0208396 A1 | 6/2023 | Hiramatsu et al. | |
| 2023/0223910 A1 | 7/2023 | Goto et al. | |
| 2023/0223917 A1 | 7/2023 | Goto et al. | |
| 2023/0231529 A1 | 7/2023 | Hiramatsu et al. | |
| 2023/0275565 A1 | 8/2023 | Tang et al. | |
| 2023/0283261 A1 | 9/2023 | Huang et al. | |
| 2023/0327630 A1 | 10/2023 | Goto et al. | |
| 2023/0327642 A1 | 10/2023 | Goto et al. | |
| 2023/0327645 A1 | 10/2023 | Goto et al. | |
| 2023/0336153 A1 | 10/2023 | Goto et al. | |
| 2023/0336159 A1 | 10/2023 | Hiramatsu et al. | |
| 2023/0344411 A1 | 10/2023 | Chen et al. | |
| 2024/0022164 A1 | 1/2024 | Gong et al. | |
| 2024/0039507 A1 | 2/2024 | Goto et al. | |
| 2024/0186978 A1 | 6/2024 | Hiramatsu et al. | |
| 2024/0223149 A1 | 7/2024 | Goto et al. | |
| 2024/0223152 A1 | 7/2024 | Goto et al. | |
| 2024/0223156 A1 | 7/2024 | Goto et al. | |
| 2024/0364305 A1 | 10/2024 | Goto | |

FOREIGN PATENT DOCUMENTS

| | | |
|---|---|---|
| JP | 2009-219045 A | 9/2009 |
| JP | 2014-135624 A | 7/2014 |
| JP | 2020-092422 A | 6/2020 |
| WO | 2017/161303 A1 | 9/2017 |

OTHER PUBLICATIONS

Kapp, M., et al., "Investigation of GeO2 thin film properties for improvement of temperature coefficient of frequency of SAW devices", 2014 European Frequency and Time Forum (EFTF), Jun. 2014, 4 pages.

Solal et al., "A method to reduce losses in buried electrodes RF SAW resonators," 2011 IEEE International Ultrasonics Symposium, 2011, pp. 324-332, doi: 10.1109/ULTSYM.2011.0078.

* cited by examiner

SURFACE ACOUSTIC WAVE DEVICE HAVING A TRAPEZOIDAL ELECTRODE

INCORPORATION BY REFERENCE TO ANY PRIORITY APPLICATIONS

This application is based upon and claims the benefit of priority from U.S. Provisional Patent Application No. 63/251,266 filed on Oct. 1, 2021. Any and all applications for which a foreign or domestic priority claim is identified in the Application Data Sheet as filed with the present application are hereby incorporated by reference under 37 CFR 1.57. The entire contents of each of the above-listed items is hereby incorporated into this document by reference and made a part of this specification for all purposes, for all that each contains.

BACKGROUND

Field

Embodiments of the invention relate to surface acoustic wave devices.

Description of Related Technology

Surface acoustic wave (SAW) devices can be implemented in radio frequency (RF) electronic systems. For instance, filters in a radio frequency front end of a mobile phone can include surface acoustic wave devices such as surface acoustic wave filters. A surface acoustic wave filter can filter a radio frequency signal. A surface acoustic wave filter can be a band pass filter. A plurality of acoustic wave filters can be arranged as a multiplexer. For example, two acoustic wave filters can be arranged as a duplexer.

SUMMARY

According to some embodiments, there is provided a surface acoustic wave device including a piezoelectric layer forming a plane with a propagation axis, a plurality of slanted interdigital transducer electrodes arranged on the piezoelectric layer in ranks that are not aligned with the propagation axis, arranged on the piezoelectric layer in the same plane, at least one non-slanted surface acoustic wave filter having an elongate axis that parallels the propagation axis, and arranged on the piezoelectric layer in the same plane, at least one trapezoid interdigital transducer electrode having one side aligned with the propagation axis and one side aligned with the ranks of slanted interdigital transducer electrodes.

A surface acoustic wave device may include, but is not limited to, a surface acoustic wave resonator, a surface acoustic wave filter, a multiplexer, a surface acoustic wave chip package, etc. A trapezoidal shape may refer to a shape having four sides, in which only two of the sides are parallel to one another.

In some examples, the at least one trapezoid interdigital transducer electrode may include a first bus bar having first fingers extending from the first bus bar. The at least one trapezoid interdigital transducer electrode may include a second bus bar having second fingers extending from the second bus bar. The first and second bus bars may be non-parallel to each other.

In some examples, the first bus bar and first fingers may be perpendicular to each other.

In some examples, the second bus bar and second fingers may be non-perpendicular to each other.

In some examples, the surface acoustic wave device may include a plurality of slanted interdigital transducer electrodes over the piezoelectric layer. A slanted interdigital transducer electrode may refer to an interdigital transducer electrode having a shape with four sides, in which opposite sides are parallel. A slanted interdigital transducer electrode may have a shape similar to that of a parallelogram.

In some examples, the surface acoustic wave device may further include a plurality of trapezoid interdigital transducer electrodes over the piezoelectric layer.

In some examples, the plurality of slanted interdigital transducer electrodes and the plurality of trapezoidal interdigital transducer electrodes may be arranged in a tessellating pattern.

In some examples, the non-slanted surface acoustic wave filter of the surface acoustic wave device can be a multi-mode surface acoustic wave filter.

In some examples, the multi-mode surface acoustic wave filter may have an elongate rectangular shape.

In some examples, the multi-mode surface acoustic wave filter may be arranged such that the sides of the multi-mode surface acoustic wave filter are parallel to peripheral edges of the surface acoustic wave device.

In some examples, the plurality of slanted interdigital transducer electrodes, the plurality of trapezoidal interdigital transducer electrodes and the multi-mode surface acoustic wave filter may be arranged in a tessellating pattern.

In some examples, at least one of the plurality of trapezoid interdigital transducer electrodes may include a first bus bar having fingers extending perpendicularly from the first bus bar. The first bus bar may be arranged adjacent to a peripheral edge of the surface acoustic wave device.

In some examples, at least one of the plurality of trapezoid interdigital transducer electrodes may include a first bus bar having fingers extending perpendicularly from the first bus bar. The first bus bar may be arranged adjacent to a side of the multi-mode surface acoustic wave filter.

In some examples, the surface acoustic wave device may further include a support substrate. The piezoelectric layer may be disposed between the support substrate and the interdigital transducer electrode.

In some examples, the surface acoustic wave device may further include a low velocity layer disposed between the support substrate and the piezoelectric layer. The low velocity layer may have an acoustic velocity lower than an acoustic velocity of the piezoelectric layer.

In some examples, the low velocity layer may be a silicon dioxide layer.

In some examples, the piezoelectric layer may be a lithium tantalate layer.

According to some embodiments, there is provided a surface acoustic wave device including a multilayer piezoelectric substrate. The multilayer piezoelectric substrate includes a support substrate and a piezoelectric layer over the support substrate, the piezoelectric layer forming a planar surface. The surface acoustic wave device further includes at least one trapezoid interdigital transducer electrode over the piezoelectric layer having a trapezoidal shape when viewed from above the planar surface and configured for positioning in a tessellating manner adjacent to but not in contact with slanted and non-slanted elements on the same planar surface.

In some examples, the surface acoustic wave device also has a non-slanted element forming a surface acoustic wave filter device and a slanted element forming an interdigital transducer electrode, the two elements nonparallel to each other, and the at least one trapezoid interdigital transducer electrode occupies an opening on the planar surface between the two nonparallel elements.

According to some embodiments, a surface acoustic wave filter can have: a piezoelectric layer having a straight edge; an array of slanted elements forming at least one rank on the piezoelectric layer that is slanted with respect to the straight edge; at least one parallel element on the piezoelectric layer having an elongate axis that is parallel to the straight edge; and at least one interdigital transducer electrode over the piezoelectric layer, the at least one interdigital transducer electrode being a trapezoid interdigital transducer electrode and having at least one side parallel to the straight edge and one side parallel to the at least one slanted rank such that the trapezoid interdigital transducer electrode efficiently fills space on the piezoelectric layer between the array and the parallel element.

In some examples, the array of slanted elements in the surface acoustic wave filter includes a plurality of slanted interdigital transducer electrodes and the at least one parallel element includes a multi-mode surface acoustic wave filter.

In some examples, the array of slanted elements and the trapezoid interdigital transducer electrode are all configured to suppress transverse modes while filtering acoustic signals.

In some examples, the surface acoustic wave filter also includes a plurality of trapezoidal interdigital transducer electrodes and a plurality of slanted interdigital transducer electrodes over the piezoelectric layer, the plurality of slanted interdigital transducer electrodes and the plurality of trapezoidal interdigital transducer electrodes arranged in a tessellating pattern such that any open spaces are occupied by at least one of the electrodes.

According to some embodiments, a radio frequency module can have: a power amplifier configured to provide a radio frequency signal; and a surface acoustic wave filter configured to filter the radio frequency signal, the surface acoustic wave filter including a piezoelectric layer, an array of elements over the piezoelectric layer having trapezoidal voids therebetween, and at least one trapezoidal interdigital transducer electrode over the piezoelectric layer configured to efficiently occupy at least one of the trapezoidal voids.

In some examples, the radio frequency module can form part of a wireless communication device, wherein the surface acoustic wave filter is further configured to suppress transverse modes.

According to some embodiments, a wireless communication device can comprise: a surface acoustic wave filter configured to provide a filtered radio frequency signal and suppress transverse modes, the surface acoustic wave filter including a piezoelectric layer, and at least one interdigital transducer electrode over the piezoelectric layer, the at least one interdigital transducer electrode being a trapezoid interdigital transducer electrode having a trapezoidal shape in the plane of the piezoelectric layer that fills trapezoidal shapes between other non-parallel elements in that plane.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

A surface acoustic wave (SAW) filter can include a plurality of resonators arranged to filter a radio frequency signal. A SAW resonator can include an interdigital transducer (IDT) electrode on a piezoelectric substrate. The SAW resonator can generate a surface acoustic wave on a surface of the piezoelectric layer on which the IDT electrode is disposed.

Certain SAW devices, such as multi-layer piezoelectric substrate SAW devices, can experience transverse modes, which can adversely affect the performance of the device. Suppressing transverse modes and achieving improved performance can be desirable. Furthermore, reducing the size of SAW devices can be desirable.

Figures 1A, 1B, 1C:
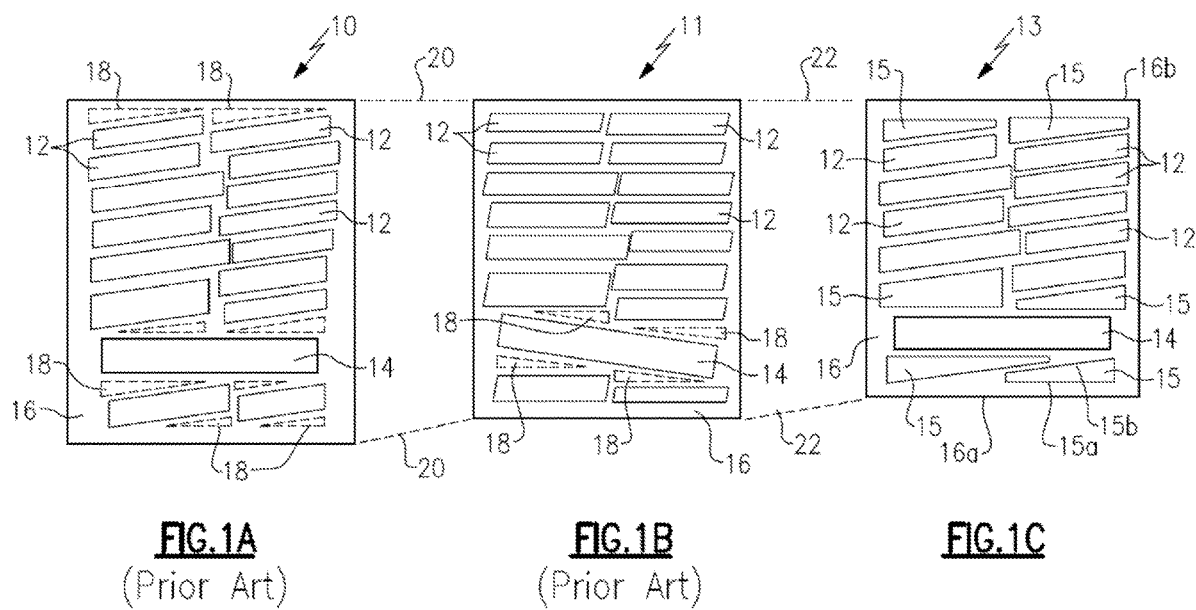
FIG. 1A is a schematic plan view of a known SAW device having slanted IDT electrodes and a dual mode surface acoustic wave filter.
FIG. 1B is a schematic plan view of another known SAW device having slanted IDT electrodes and a dual mode surface acoustic wave filter.
FIG. 1C is a schematic plan view of a SAW device according to an embodiment.

Discussed herein are solutions for suppressing transverse modes and reducing the size of SAW devices. FIG. 1A illustrates an example of a known SAW device 10 comprising a plurality of slanted IDT electrodes 12 arranged (e.g., in ranks) over a multi-layer piezoelectric substrate 16. Slanted IDT electrodes are known to provide effective transverse mode suppression for multi-layer piezoelectric substrates.

The SAW device 10 of FIG. 1A also includes a multi-mode or dual mode SAW filter 14. A multi-mode SAW filter is a type of surface acoustic wave filter. Multi-mode SAW filters include a plurality of IDT electrodes that are longitudinally coupled to each other and positioned between acoustic reflectors. Some multi-mode SAW filters are referred to as dual mode SAW filters, although such filters may have more than two modes. Multi or dual mode SAW filters have rectangular shaped IDT electrodes in which the fingers extend perpendicularly from both bus bars of the interdigital transducer electrode. A rectangular shaped IDT electrode may be referred to as a normal IDT electrode.

As discussed below in more detail with respect to FIG. 2B, a slanted IDT electrode has fingers that extend non-perpendicularly from the bus bars (that is, in a direction generally transverse to the elongate dimension of the slanted electrodes 12 in FIG. 1A but not orthogonal). Surface acoustic waves propagate in the piezoelectric substrate perpendicular to the fingers of the IDT electrode (that is, generally in the horizontal direction in FIG. 1A). Therefore, to align the propagation direction of the surface acoustic wave parallel to a horizontal reference axis corresponding to a lower edge of the piezoelectric substrate 16 in FIG. 1A, the slanted IDT electrodes in the SAW device of FIG. 1A have been rotated or angled anticlockwise from the horizontal. The rotated and slanted configuration reduces the efficiency with which the interdigital transducer electrodes can be arranged on the piezoelectric substrate 16 and therefore limits the extent to which the size of the piezoelectric substrate 16 can be reduced. As can be seen in FIG. 1A there is a considerable amount of dead space 18 (denoted generally by the triangles having dotted lines in FIG. 1A) on the piezoelectric substrate 16, particularly at the edges of the substrate 16 and adjacent to the dual mode SAW filter 14.

The dual mode SAW filter 14 of the SAW device 10 of FIG. 1A is arranged parallel to the horizontal reference axis corresponding to a lower edge of the piezoelectric substrate 16 such that the propagation direction of the surface acoustic waves within the dual mode SAW filter 14 is also parallel to the horizontal reference axis. As can be seen in FIG. 1A, this arrangement results in additional dead space 18 between the dual mode SAW filter 14 and the slanted IDT electrodes 12. Indeed the mixed topology of slanted IDT electrodes 12 and the nonslanted dual mode SAW filter 14 results in significant losses in the area of the piezoelectric substrate 16 that is used. Ranks of slanted electrodes 12, when juxtaposed with non-slanted elements like the multi-mode SAW filter 14, can leave irregular-shaped gaps or unused substrate in the space between such elements on a given plane. These gaps can be generally trapezoidal.

FIG. 1B illustrates another example of a SAW device 11 comprising a plurality of slanted IDT electrodes 12 arranged over a multi-layer piezoelectric substrate 16 and a dual mode SAW filter 14. In the SAW device 11 of FIG. 1B, a wafer on which the piezoelectric substrate 16 is formed has been pre-rotated to compensate for the propagation direction of the surface acoustic wave in the slanted IDT electrodes 12. The rotation characteristics of a SAW device can be represented by Euler angles ($\varphi$, $\theta$, $\psi$). The rotation characteristics of the SAW device 11 of FIG. 1B can be represented by the Euler angles (0, 132, 8), where the third Euler angle $\psi$ (8 degrees) represents the pre-rotation of the wafer. By rotating the wafer, the slanted IDT electrodes 12 can be arranged horizontally (e.g., aligned in ranks) on the piezoelectric substrate 16, i.e. with their longitudinal edges arranged parallel to the horizontal reference axis corresponding to a lower edge of the piezoelectric substrate 16 in FIG. 1B. However, this has necessitated that the dual mode SAW filter 14 also be rotated so that the propagation direction of the surface acoustic wave in the dual mode SAW filter 14 is aligned with that of the wafer. As a result, there is dead space 18 (denoted by the triangles having dotted lines in FIG. 1B) between the dual mode SAW filter 14 and the ranks of slanted IDT electrodes 12 arranged adjacent to it. This dead space can be described as a gap. Such gaps can be filled (e.g., substantially filled, given a minimum inter-element spacing) by a tessellating pattern if appropriately-shaped electrodes are provided. Trapezoidal IDT electrodes can provide such a function, filling gaps between ranks of slanted electrodes and one or more nonslanted electrodes or gaps between such elements and the edge of a wafer, for example.

As can be seen by comparing FIGS. 1A and 1B, the amount of dead space 18 in the SAW device 11 of FIG. 1B is less than that in FIG. 1A and a size reduction has been achieved in the SAW device 11 of FIG. 1B (as denoted by dotted lines 20). However, there is still a loss in the area of the piezoelectric substrate 16 that can be used, which limits further size reduction.

Aspects and embodiments described herein are directed to SAW devices having trapezoidal IDT electrodes. Trapezoidal IDT electrodes have been found to reduce transverse modes. Furthermore, trapezoidal IDT electrodes have been found to provide for a more efficient or compact arrangement of components in a surface acoustic wave device with reduced dead space and without having to pre-rotate the wafer on which the device is formed. Trapezoidal IDT electrodes have been found to provide a particularly efficient or compact arrangement of components in a surface acoustic wave device having a mixed topology of slanted IDT electrodes and multi-mode or dual mode SAW filters.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to spatial orientation such as "horizontal" or "vertical" are with reference to the Figures, unless the context suggests otherwise, and are not intended to be limiting.

Surface acoustic wave (SAW) devices can be used in a variety of applications, such as to filter a radio frequency (RF) signal in an RF front end of a mobile phone. SAW devices include SAW resonators, SAW delay lines, SAW filters such as multi-mode SAW filters (e.g. dual mode SAW filters) and SAW chip packages. A SAW filter can be implemented with SAW resonators. A SAW resonator can be configured to generate, for example, a Rayleigh mode surface acoustic wave or a shear horizontal mode surface acoustic wave.

SAW devices can include a multilayer piezoelectric substrate. Multi-layer piezoelectric substrates can provide high quality factor (Q), large effective electromechanical coupling coefficient (k2), improved temperature coefficient of frequency and good thermal dissipation characteristics relative to certain single layer piezoelectric substrates. For example, certain SAW devices with a piezoelectric layer on a high impedance layer, such as silicon, can achieve a better temperature coefficient of frequency (TCF) and thermal dissipation compared to similar devices without the high impedance layer. A better TCF can contribute to obtaining the large effective electromechanical coupling coefficient (k2). However, multilayer piezoelectric substrates typically require the use of larger resonators compared to other SAW devices such as temperature-compensated SAW devices. Therefore, efficient use of space on multilayer piezoelectric substrates is a key focus area for SAW filter development.

SAW devices can have a relatively strong transverse mode in and/or near a pass band. The presence of the relatively strong transverse modes can hinder the accuracy and/or stability of SAW devices, as well as hurt the performance of SAW filters by creating relatively severe passband ripples, thereby possibly limiting reception in the passband, and possibly limiting the rejection outside the passband. Therefore, suppressing these transverse modes in SAW devices is desirable.

Slanted IDT electrodes are known to provide an effective method of suppressing transverse modes. However, they are more difficult to arrange compactly in a SAW device and often result in dead space within the device (See FIG. 1A). As described above, pre-rotation of the wafer on which the SAW device is formed can help to achieve a more efficient arrangement (See FIG. 1B). However, this requires an additional manufacturing step. Moreover, a mixed topology of slanted IDT electrodes and a nonslanted dual mode SAW filter still results in dead space within the device (See FIG. 1B). It would therefore be desirable to be able to achieve further size reductions in such SAW devices.

FIG. 1C schematically shows a SAW device 13 according to some embodiments of the present disclosure. The SAW device 13 is a SAW filter and comprises a piezoelectric layer 16 and a plurality of slanted IDT electrodes 12, a plurality of trapezoid IDT electrodes 15 and a dual mode SAW filter 14 over the piezoelectric layer 16. Each of the slanted IDT electrodes 12 and trapezoid IDT electrodes 15, in combination with the underlying piezoelectric layer 16, defines an individual SAW resonator. The shapes of each of the slanted IDT electrodes 12, trapezoid IDT electrodes and dual mode SAW filter 14 are discussed in more detail with respect to FIGS. 2A to 2C below.

Similar to the SAW device 10 of FIG. 1A, the slanted IDT electrodes in the SAW device 13 of FIG. 1C are not arranged horizontally, i.e. parallel to a horizontal reference axis corresponding to a lower edge of the piezoelectric layer 16 in FIG. 1C, but have been rotated or angled anticlockwise from the horizontal in order to align the propagation direction of the surface acoustic wave parallel to a horizontal reference axis. This avoids the need to pre-rotate the piezoelectric layer 16 like in the arrangement of FIG. 1B.

In the SAW device 13 of FIG. 1C, the dual mode SAW filter 14 has been arranged horizontally, i.e. parallel to a horizontal reference axis corresponding to a lower edge of the piezoelectric layer 16 in FIG. 1C. There is no need to rotate it like in the arrangement of FIG. 1B to align it with surface acoustic wave propagation direction.

In the SAW device 13 of FIG. 1C, the trapezoid IDT electrodes 15 have been arranged adjacent to the peripheral edges 16a and 16b of the piezoelectric substrate 16 and adjacent to the dual mode SAW filter 14. In particular, the flat or horizontal edges 15a of the trapezoid IDT electrodes 15 are located adjacent to the peripheral edges 16a and 16b of the piezoelectric substrate 16 and adjacent to the dual mode SAW filter 14. The sloped or inclined edges 15b of the trapezoid IDT electrodes 15 are located adjacent to the slanted IDT electrodes 12 or adjacent to another inclined edge 15b of another trapezoid IDT electrode 15.

The location of the trapezoid IDT electrodes in the SAW device 13 of FIG. 1C generally corresponds to the location of the dead space 18 in the SAW device 10 of FIG. 1A. Therefore, the trapezoid IDT electrodes allow dead space 18 (or gaps) to be effectively utilized, thereby reducing area losses on the piezoelectric layer 16. Furthermore, the trapezoid IDT electrodes allow the various components of the SAW device 13 to be arranged in a tessellating pattern. Thus, the shapes of the IDT electrodes 12 and 15 and the dual mode SAW filter 14 can be fitted together closely without significant gaps or overlaps. This provides for a more compact arrangement of the components within the SAW device 13 and helps to reduce the size of the device compared to previous known devices (as denoted by dotted lines 22 in FIGS. 1A-1C). FIG. 1C thus includes a plurality of slanted IDT electrodes 12 arranged on the piezoelectric layer in ranks (e.g., generally transverse rows) that are not aligned with the propagation axis. Arranged on the piezoelectric layer 16 in the same plane is the non-slanted SAW filter 14, which has an elongate axis that parallels the propagation axis. Arranged on the piezoelectric layer 16 in the same plane are the trapezoid IDT electrodes 15 having one side aligned with the propagation axis and one side aligned with the ranks of slanted IDT electrodes 12. The slanted IDT electrodes 12 are nonparallel to the SAW filter 14, and the trapezoid IDT electrodes 15 are arranged to occupy openings on the planar surface 16 between the two nonparallel element types to form a generally tessellating pattern.

The peripheral edges 16a and 16b of the piezoelectric substrate 16 may correspond to the edge of a die or chip which has been cut from a larger wafer containing numerous SAW devices. The peripheral edges 16a and 16b of the piezoelectric substrate 16 may correspond to the peripheral edges of the SAW device 13.

Figure 2A:
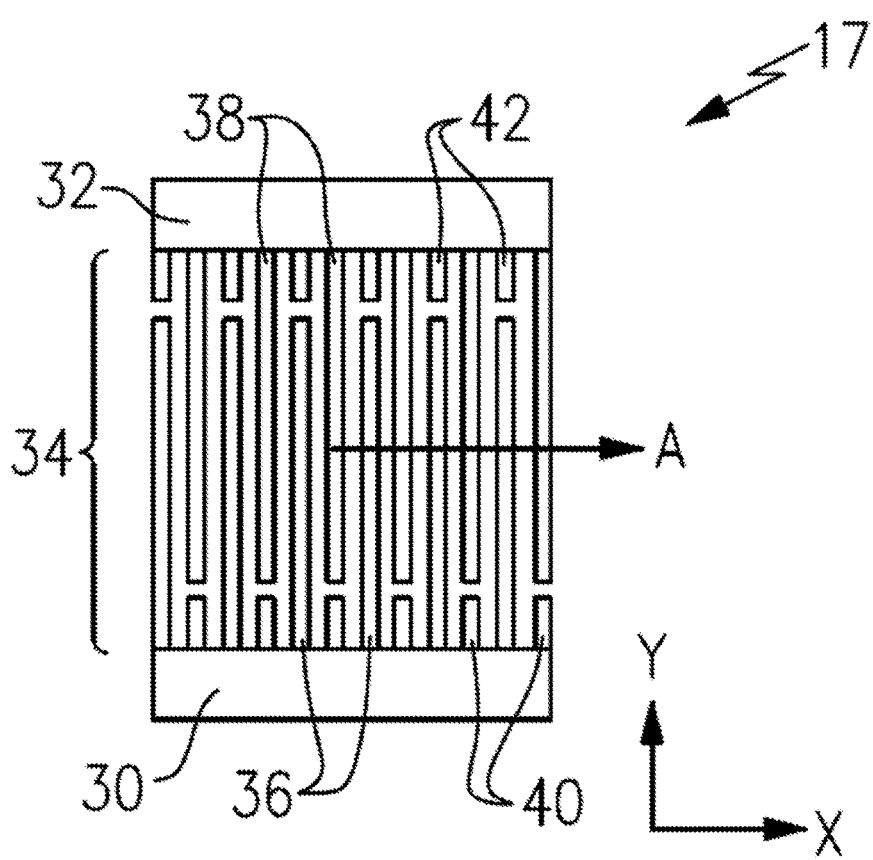
FIG. 2A is a schematic plan view of a normal rectangular shaped IDT electrode.

FIG. 2A is a schematic plan view of a normal rectangular-shaped IDT electrode 17 comprising a first bus bar 30, a second bus bar 32 and a finger region 34. The finger region 34 is positioned between the first bus bar 30 and the second bus bar 32. The finger region 34 includes first fingers 36 that extend from the first bus bar 30 and second fingers 38 that extend from the second bus bar 32. The finger region 34 includes first dummy fingers 40 that extend from the first bus bar 30 and second dummy fingers 42 that extend from the second bus bar 32. The first dummy fingers 40 are shorter than the first fingers 36 and the second dummy fingers 42 are shorter than the second fingers 38. The first 40 and second 42 dummy fingers can function as pseudo-electrodes for preventing interference with the propagation of a wave generated by the first 36 and second 38 fingers.

The first bus bar 30 and the second bus bar 32 extend in parallel along a horizontal axis x. The first fingers 36 and the second fingers 38 extend perpendicularly to the elongate dimension (here illustrated as the x-dimension) of the first bus bar 30 and the second bus bar 32. Thus, these fingers extend along a vertical axis y that is perpendicular to the horizontal axis x.

The IDT electrode 17 generates a surface acoustic wave which propagates in a direction perpendicular to the first 36 and second 38 fingers, i.e. in the direction of arrow A in FIG. 2A (corresponding to the horizontal, or positive x direction). A plurality of the IDT electrodes 17 are included in the dual mode SAW filter 14 of the SAW device 13 of FIG. 1C. In the dual mode SAW filter 14, the IDT electrodes 17 are longitudinally coupled to each other and positioned between acoustic reflectors.

Figure 2B:
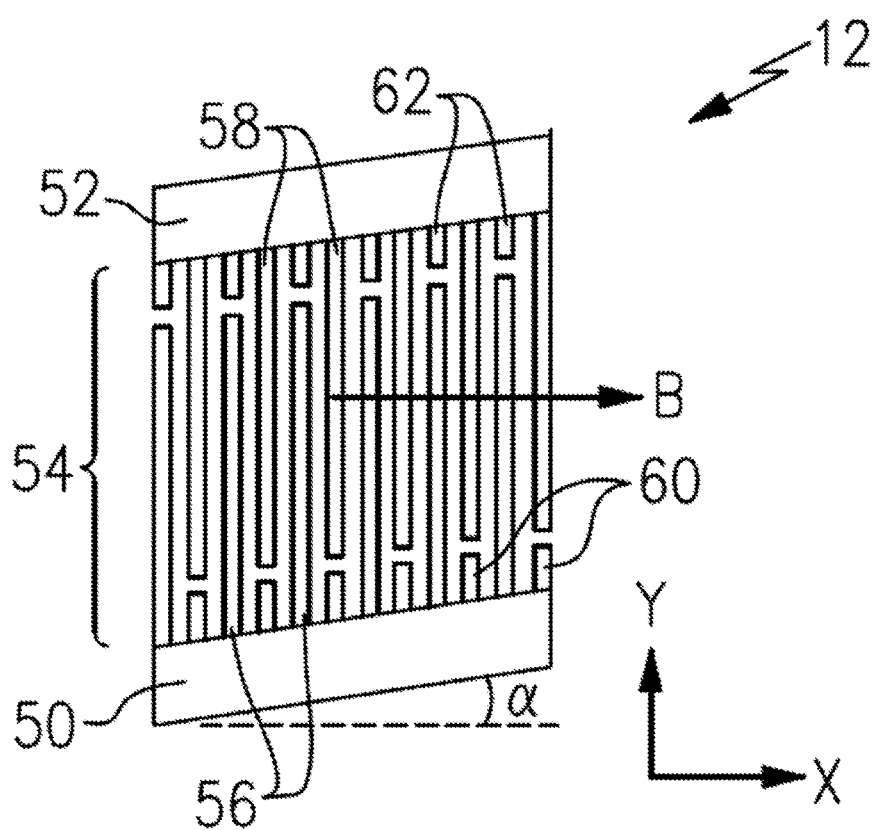
FIG. 2B is a schematic plan view of a slanted IDT electrode.

FIG. 2B is a schematic plan view of a slanted IDT electrode 12 comprising a first bus bar 50, a second bus bar 52 and a finger region 54. The finger region 34 is positioned between the first bus bar 50 and the second bus bar 52. The finger region 54 includes first fingers 56 that extend from the first bus bar 50 and second fingers 58 that extend from the second bus bar 52. The finger region 54 includes first dummy fingers 60 that extend from the first bus bar 50 and second dummy fingers 62 that extend from the second bus bar 52. The first dummy fingers 60 and second dummy fingers 62 have the same function as in the IDT electrode 17 of FIG. 2A.

The IDT electrode 12 has been tilted or slanted such that the first fingers 56 and the second fingers 58 extend non-perpendicularly to the first bus bar 50 and the second bus bar 52. The slanted IDT electrode 12 generates a surface acoustic wave which propagates in a direction perpendicular to the first fingers 56 and second fingers 58. To align the propagation direction of the surface acoustic wave parallel to a horizontal reference axis x, the slanted IDT electrode 12 has been rotated anticlockwise by an angle α relative to the horizontal axis x such that surface acoustic wave propagates in the direction of arrow B in FIG. 2B (corresponding to the horizontal, or positive x direction). In this orientation, the first bus bar 50 and the second bus bar 52 extend in parallel at an angle α to the horizontal axis x. The first fingers 56 and the second fingers 58 extend along a vertical axis y that is perpendicular to the horizontal axis x.

Figure 2C:
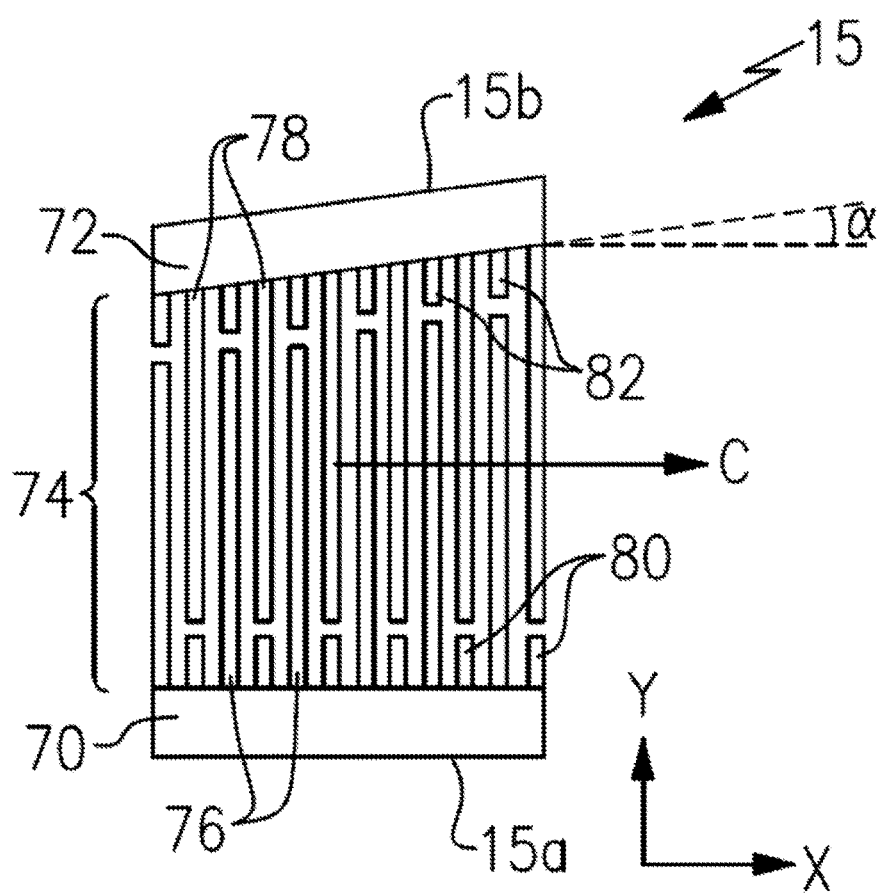
FIG. 2C is a schematic plan view of a trapezoid IDT electrode according to an embodiment.

FIG. 2C is a schematic plan view of a trapezoid IDT electrode 15 comprising a first bus bar 70, a second bus bar 72 and a finger region 74. The finger region 74 is positioned between the first bus bar 70 and the second bus bar 72. The finger region 74 does not have a constant width, given that the us bars are diverging to the right in this depiction. The finger region 74 includes first fingers 76 that extend from the first bus bar 70 and second fingers 78 that extend from the second bus bar 72. The finger region 74 includes first dummy fingers 80 that extend from the first bus bar 70 and second dummy fingers 82 that extend from the second bus bar 82. The first dummy fingers 80 and second dummy fingers 82 have the same function as in the IDT electrode 17 of FIG. 2A.

The first bus bar 70 extends parallel to a horizontal axis x and the first fingers 76 extend perpendicularly to the first bus bar 30 along a vertical axis y that is perpendicular to the horizontal axis x. The first bus bar 70 defines a flat or horizontal edge 15a of the trapezoid IDT electrode 15. The second bus bar 72 extends at an angle α with respect to the horizontal axis x and the second fingers 78 extend non-perpendicularly to the second bus bar 72 and along a vertical axis y that is perpendicular to the horizontal axis x. The second bus bar 72 defines an inclined edge of the trapezoid IDT electrode 15. The trapezoid IDT electrode 15 generates a surface acoustic wave which propagates in a direction perpendicular to the first 76 and second 78 fingers, i.e. in the direction of arrow C in FIG. 2C (corresponding to the horizontal, or positive x direction).

Figure 3A:
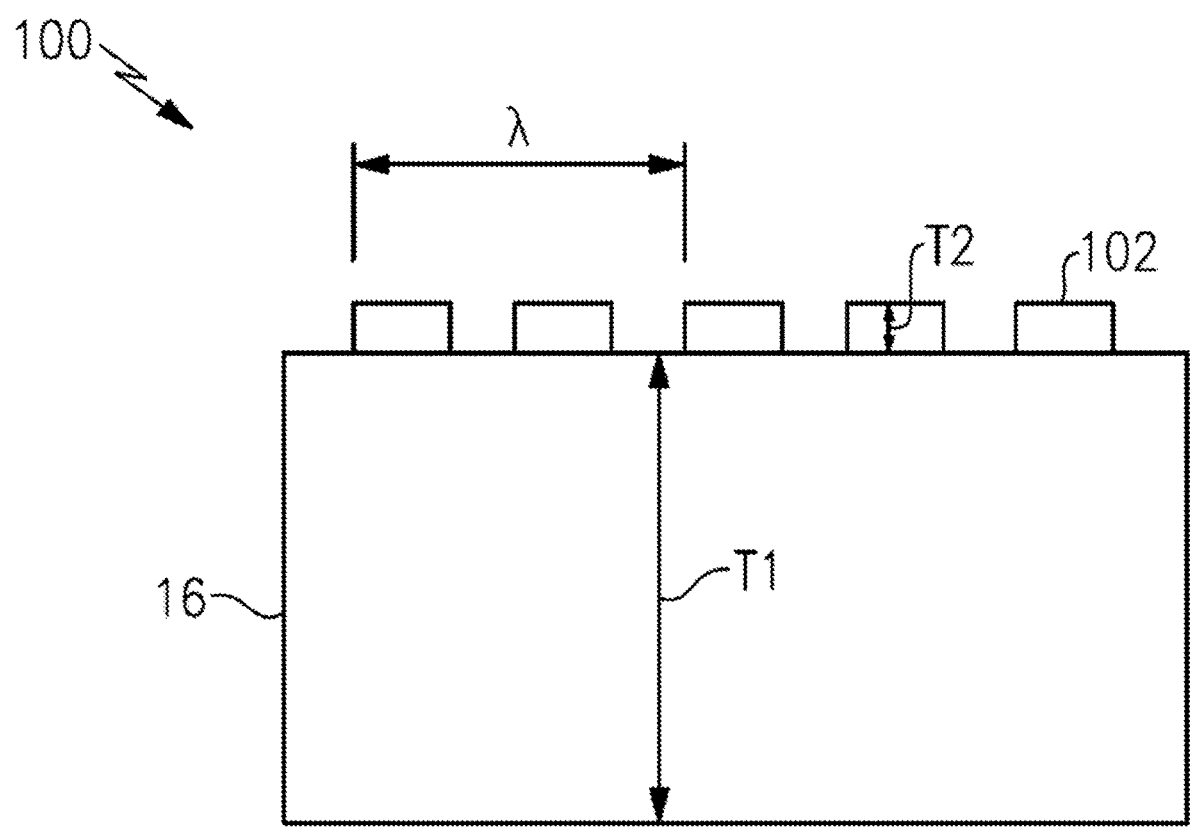
FIG. 3A is a schematic cross-section of a SAW device according to an embodiment.

FIG. 3A is a cross-sectional view of a SAW device 100 according to an embodiment. In some embodiments, the SAW device 13 illustrated in FIG. 1C can have the cross-section illustrated in FIG. 3A. The illustrated SAW device 100 includes a piezoelectric layer 16 and an IDT electrode 102 on the piezoelectric layer 16 (see, e.g., the ranks of slanted IDT electrodes 12, the non-slanted SAW filter 14, the trapezoid IDT electrodes 15, the tessellating pattern, etc. of FIG. 1C). The piezoelectric layer 16 can be a lithium niobate layer or a lithium tantalate layer, for example. The IDT electrode 102 can be implemented using any of the shapes shown in FIGS. 2A to 2C.

The IDT electrode 102 can include any suitable IDT electrode material. For example, the IDT electrode 102 can include one or more of an aluminum (Al) layer, a molybdenum (Mo) layer, a tungsten (W) layer, a titanium (Ti) layer, a platinum (Pt) layer, a gold (Au) layer, a silver (Ag) layer, copper (Cu) layer, a Magnesium (Mg) layer, a ruthenium (Ru) layer, or the like. The IDT electrode 102 may include alloys, such as AlMgCu, AlCu, etc. In some embodiments, the IDT electrode 102 can be multi-layer IDT electrodes. As an example, a multi-layer IDT electrode can include an Al layer over a Mo layer or an Al layer over a W layer.

Figure 3B:
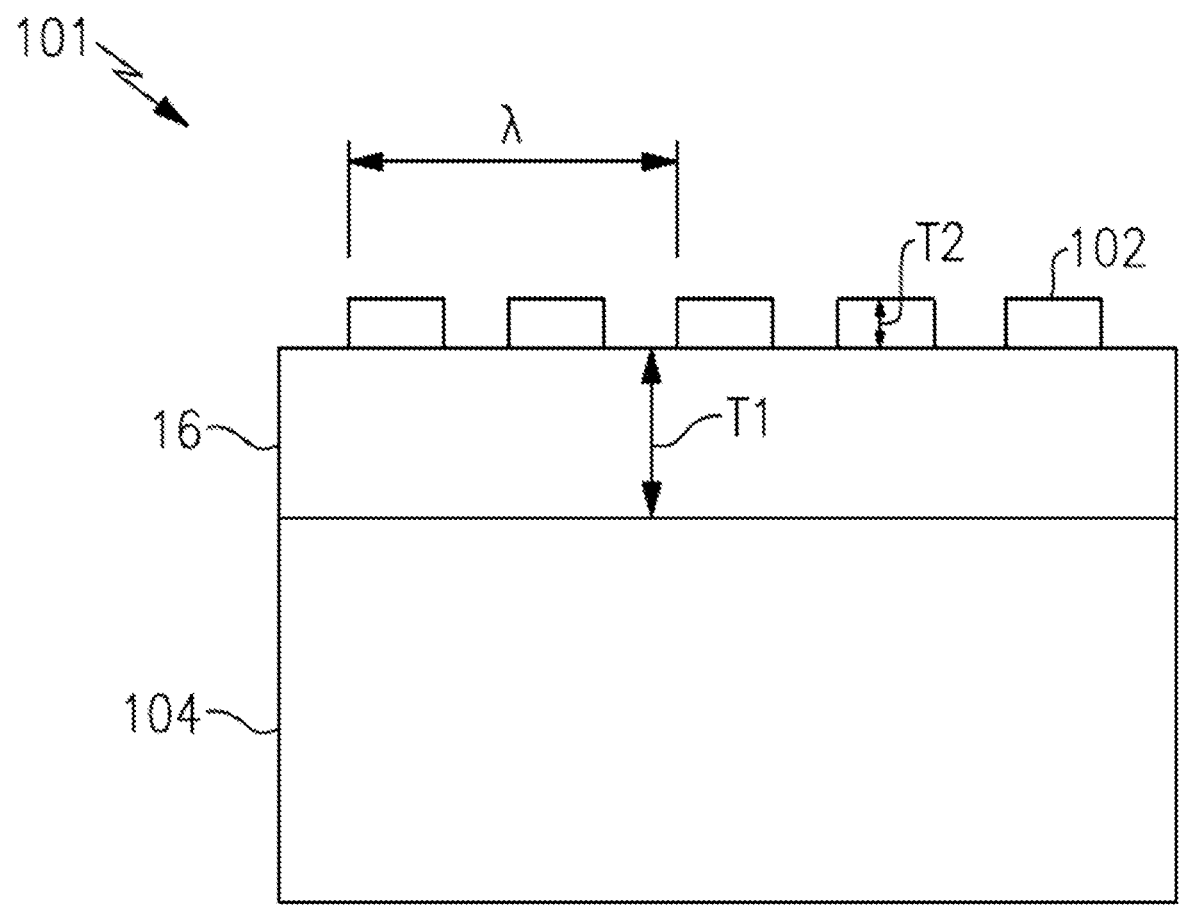
FIG. 3B is a schematic cross-section of a multilayer piezoelectric substrate SAW device according to an embodiment.

FIG. 3B is a cross-sectional view of a SAW device 101 according to another embodiment. In some embodiments, the SAW device 13 illustrated in FIG. 1C can have the cross-section illustrated in FIG. 3B. The SAW device 101 is like the SAW device 100 illustrated in FIG. 3A, except the SAW device 101 includes a support substrate 104 under the piezoelectric layer 16. The support substrate 104 can be a silicon substrate, a quartz substrate, a sapphire substrate, a polycrystalline spinel substrate, or any other suitable carrier substrate. In an embodiment of the SAW device 101, the piezoelectric layer 16 can be a lithium tantalate layer and the support substrate 104 can be a spinel support substrate.

Figure 3C:
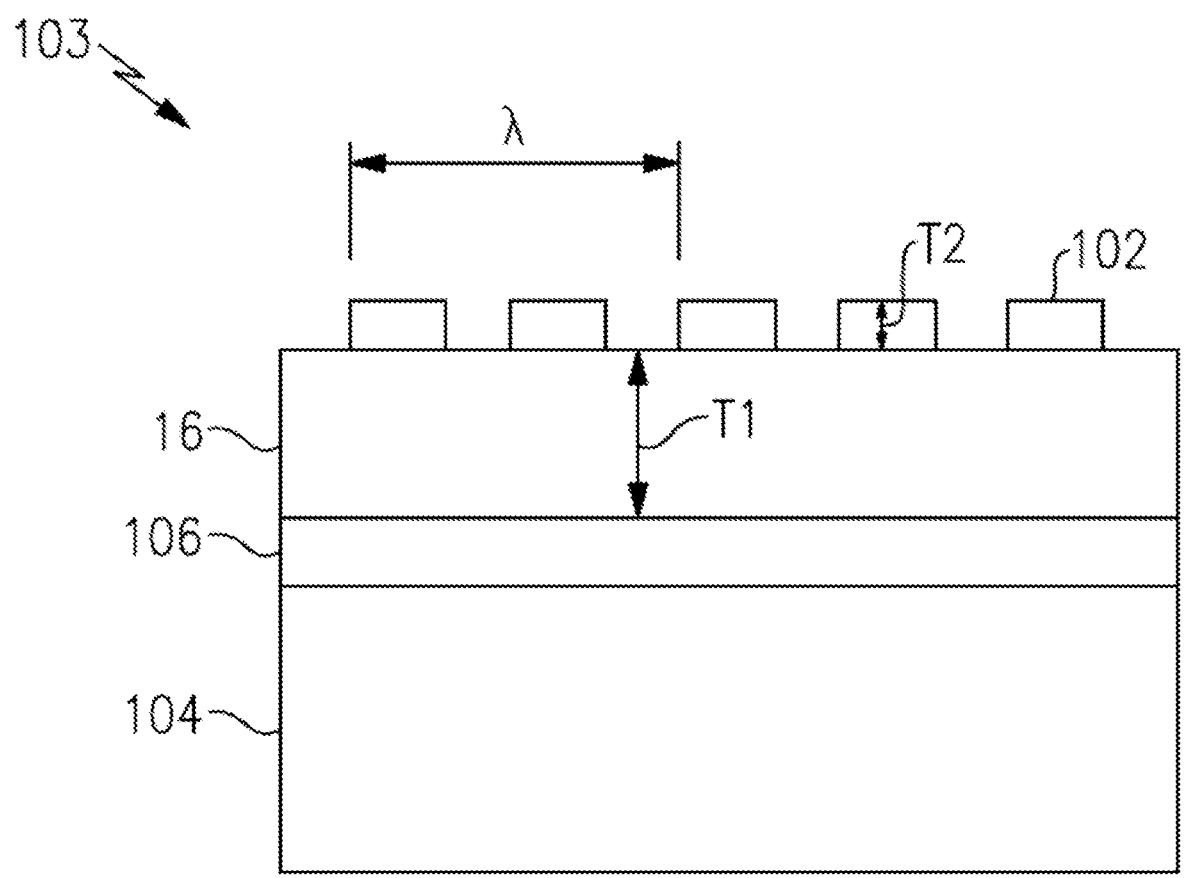
FIG. 3C is a schematic cross-section of a multilayer piezoelectric substrate SAW device according to another embodiment.

FIG. 3C is a cross-sectional view of a SAW device 103 according to another embodiment. In some embodiments, the SAW device 13 illustrated in FIG. 1C can have the cross-section illustrated in FIG. 3C. The SAW device 103 is like the SAW device 101 illustrated in FIG. 3B, except the SAW device 103 includes a low velocity layer 106 between the piezoelectric layer 16 and the support substrate 104. The low velocity layer 106 can include any suitable material that has an acoustic velocity lower than an acoustic velocity of the piezoelectric layer 16. For example, the low velocity layer 106 can be a silicon oxide layer such as a silicon dioxide layer. In an embodiment of the SAW device 103, the piezoelectric layer 16 can be a lithium tantalate layer, the low velocity layer 106 can be a silicon dioxide layer, and the support substrate 104 can be a silicon substrate.

In the SAW devices 100, 101, 103 of FIGS. 3A to 3C, the piezoelectric layer 16 has a thickness T1. The thickness T1 of the piezoelectric layer 16 can be selected based on a wavelength λ of a surface acoustic wave generated by the surface acoustic wave device. The piezoelectric layer 16 can be sufficiently thick to provide good coupling factor. A thickness T1 of the piezoelectric layer 16 of at least 0.1λ can be sufficiently thick to mitigate degradation of the coupling factor due to a relatively thin piezoelectric layer 16. The thickness T1 of the piezoelectric layer 16 can be in a range of, for example, 0.1λ to 0.5λ. In some instances, the thickness T1 of the piezoelectric layer 16 can be in a range from 0.3λ to 0.5λ. The wavelength λ of the surface acoustic wave can be, for example, 2 microns and the thickness T1 of the piezoelectric layer 16 can be, for example 0.6 microns, in some embodiments. According to some other instances, the thickness of T1 of the piezoelectric layer 16 can on the order of 10 s of λ. The thickness of the piezoelectric layer 16 can be in a range from about 20 microns to 30 microns in certain applications.

In the SAW devices 100, 101, 103 of FIGS. 3A to 3C, the IDT electrode 102 has a thickness T2. In some embodiments, the thickness T2 can be about 0.04λ. In some embodiments, the thickness T2 can be in a range from 0.01λ to 0.08λ. For example, when the wavelength λ is 2 microns, the thickness T2 of the IDT electrodes 102 can be 80 nanometers.

Figure 4A:
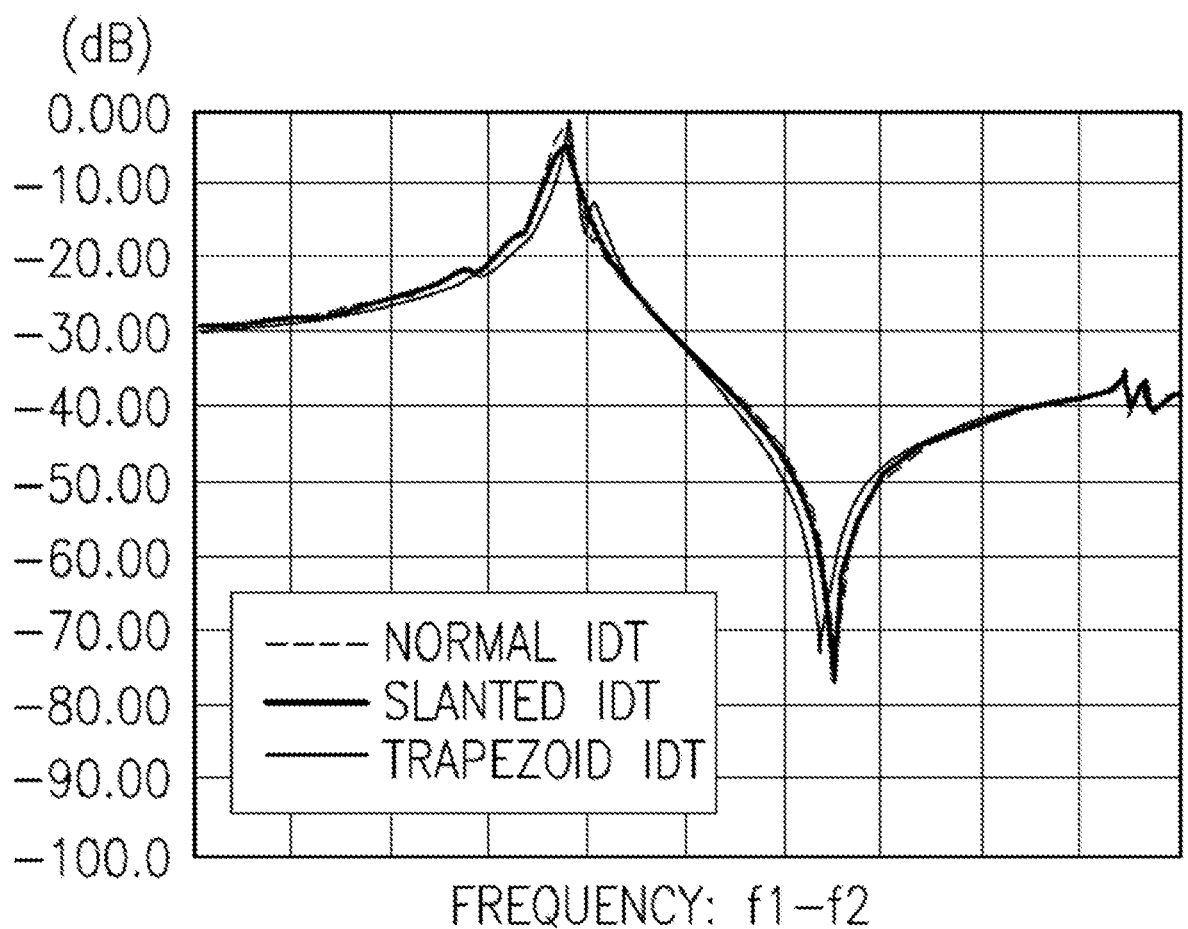
FIG. 4A is a graph illustrating admittance characteristics of SAW devices having normal, slanted and trapezoid IDT electrodes over a frequency range f1 to f2.
Figure 4B:
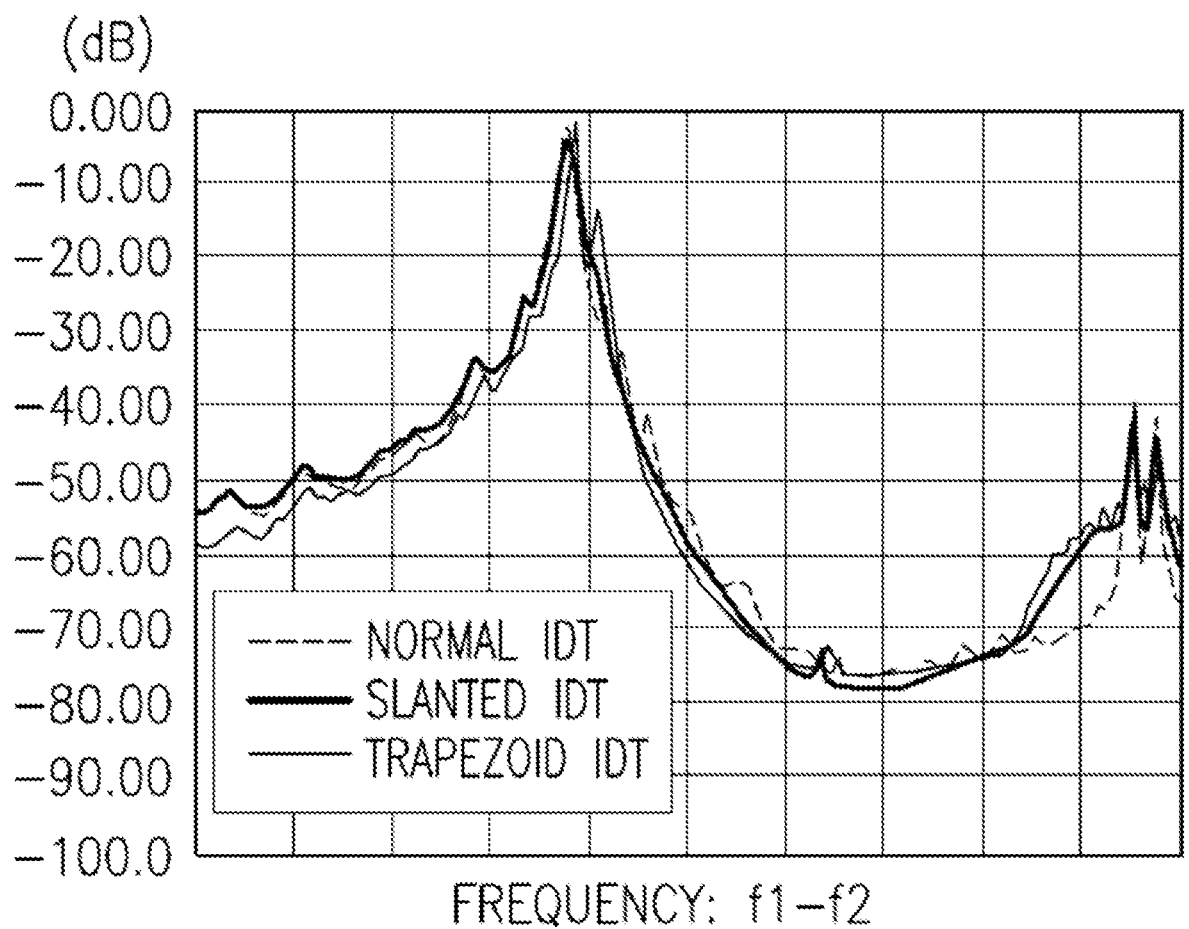
FIG. 4B is a graph illustrating the real part of admittance characteristics of SAW devices having normal, slanted and trapezoid IDT electrodes over a frequency range f1 to f2.
Figure 4C:
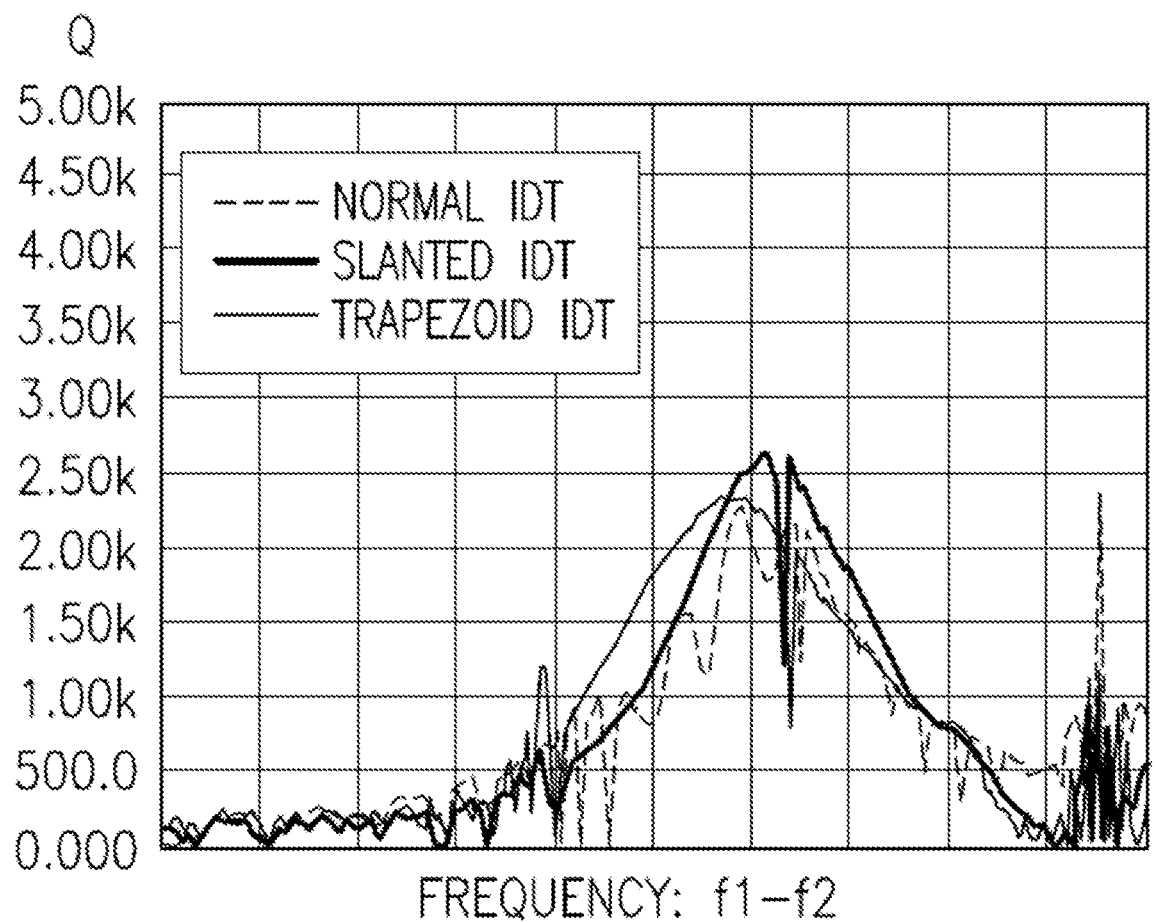
FIG. 4C is a graph illustrating quality (Q) factor of SAW devices having normal, slanted and trapezoid IDT electrodes over a frequency range f1 to f2.

It has been found that a trapezoid IDT electrode (trapezoid in the plan view shown in FIG. 1C) can suppress transverse modes in SAW devices. FIGS. 4A, 4B, and 4C illustrate curves of the admittance characteristic (FIG. 4A), the real part of the admittance characteristic (FIG. 4B), and the quality factor (Q) (FIG. 4C) of SAW devices having normal (dashed line), slanted (thick solid line) and trapezoid (thin solid line) IDT electrodes over the frequency range f1 to f2. The frequency range f1 to f2 represents an operating range of frequencies for a wireless communication device such as a mobile phone.

As illustrated in FIG. 4B, some spurious responses can be found in the real part of the admittance characteristic of the SAW device having a normal rectangular-shaped IDT electrode within a frequency band corresponding to the transition between the resonance and the anti-resonance frequency in the admittance characteristic of FIG. 4A. As can be seen in the curve of the SAW device having a slanted IDT, such spurious responses are suppressed. Furthermore, as illustrated in the curve of the SAW device having a trapezoid IDT, spurious responses are significantly suppressed, with only the odd spur being present.

As illustrated in FIG. 4C, a SAW device having a slanted IDT electrode achieves the highest Q factor and a Q factor distribution which is consistently higher than a SAW device having a normal rectangular-shaped IDT electrode. However, a SAW device having a trapezoid IDT electrode also achieves on average a higher Q factor than a SAW device having a normal rectangular-shaped IDT electrode. Therefore, it can be seen from FIGS. 4A to 4C that a SAW device having a trapezoid IDT electrode is effective at suppressing transverse modes while also maintaining a high Q factor.

Figure 5:
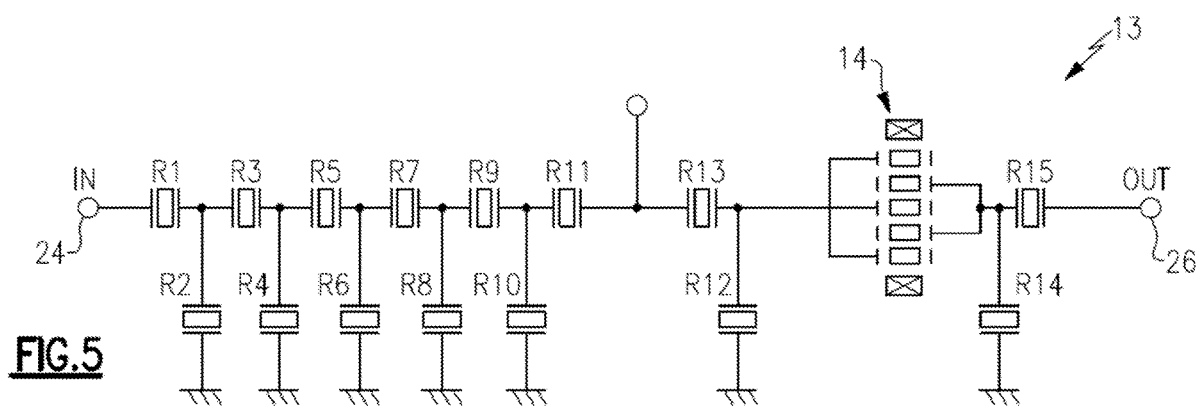
FIG. 5 is a circuit diagram of the SAW device of FIG. 1C.

FIG. 5 is a circuit diagram of the SAW device 13 of FIG. 1C. As discussed above, the SAW device 13 is a filter which receives an RF signal at an input terminal 24 and provides a filtered signal at an output terminal 26. The SAW device 13 can be a band pass filter. As can be seen in FIG. 5, the SAW device 13 is a ladder filter including a plurality of series resonators R1, R3, R5, R7, R9, R11, R13 and R15 and a plurality of shunt resonators R2, R4, R6, R8, R10, R12 and R14. The plurality of series resonators R1, R3 . . . R15 are connected in series between the input terminal 24 and the output terminal 26 of the SAW device 13 and the plurality of shunt resonators R2, R4 . . . R14 are respectively connected between series resonators and ground in a shunt configuration. Each of the resonators R1 to R15 corresponds to one of the IDT electrodes 12, 15 in the SAW device 13 of FIG. 1C. Resonators R1, R2, R12, R13, R14 and R15 correspond to the trapezoid IDT electrodes 15 in the SAW device 13 of FIG. 1C. The dual mode SAW filter 14 of the SAW device 13 of FIG. 1C can be seen arranged in series between resonators R13 and R15.

Figure 6:
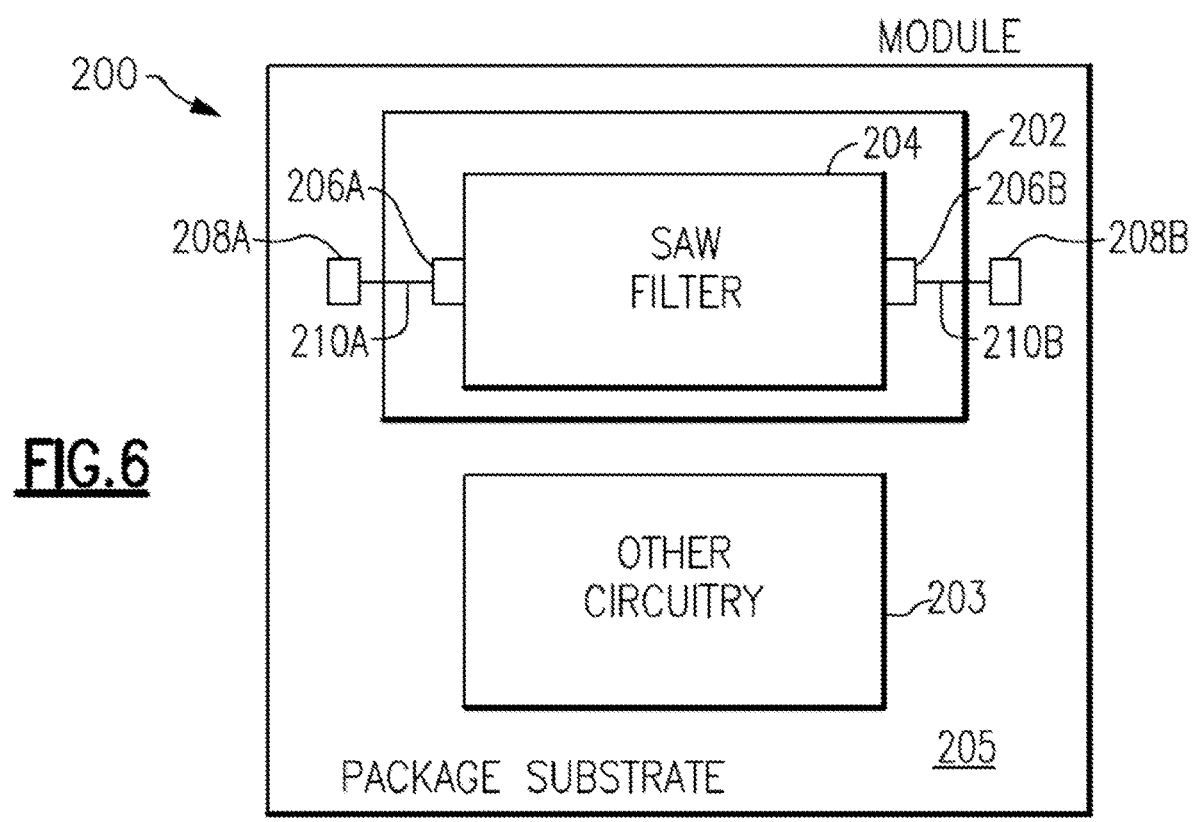
FIG. 6 is a schematic diagram of a radio frequency module that includes a SAW device according to an embodiment.

FIG. 6 is a schematic diagram of a radio frequency module 200 that includes a SAW component 202 according to an embodiment and other circuitry 203. The SAW component 202 can include one or more SAW devices with any suitable combination of features of the SAW devices disclosed herein. The SAW component 202 can include a SAW die that includes SAW resonators.

The SAW component 202 shown in FIG. 6 includes a SAW filter 204 and terminals 206A and 206B. The SAW filter 204 includes SAW resonators and can be implemented in accordance with any suitable principles and advantages of the SAW devices disclosed herein. The SAW filter 204 can be arranged as a band pass filter to filter radio frequency signals with frequencies below about 3.5 GHz in certain applications. The terminals 206A and 206B can serve, for example, as an input contact and an output contact. The SAW component 202 and the other circuitry 203 are on a common packaging substrate 205 in FIG. 6. The package substrate 205 can be a laminate substrate. The terminals 206A and 206B can be electrically connected to contacts 208A and 208B, respectively, on the packaging substrate 205 by way of electrical connectors 210A and 210B, respectively. The electrical connectors 210A and 210B can be bumps or wire bonds, for example. The other circuitry 203 can include any suitable additional circuitry. For example, the other circuitry can include one or more power amplifiers, one or more radio frequency switches, one or more additional filters, one or more low noise amplifiers, and the like, or any suitable combination thereof. The radio frequency module 200 can include one or more packaging structures to, for example, provide protection and/or facilitate easier handling of the radio frequency module 200. Such a packaging structure can include an overmold structure formed over the packaging substrate 205. The overmold structure can encapsulate some or all of the components of the radio frequency module 200.

Various examples and embodiments of the SAW filter 204 can be used in a wide variety of electronic devices. For example, the SAW filter 204 can be used in an antenna duplexer, which itself can be incorporated into a variety of electronic devices, such as RF front-end modules and wireless communication devices.

Figure 7:
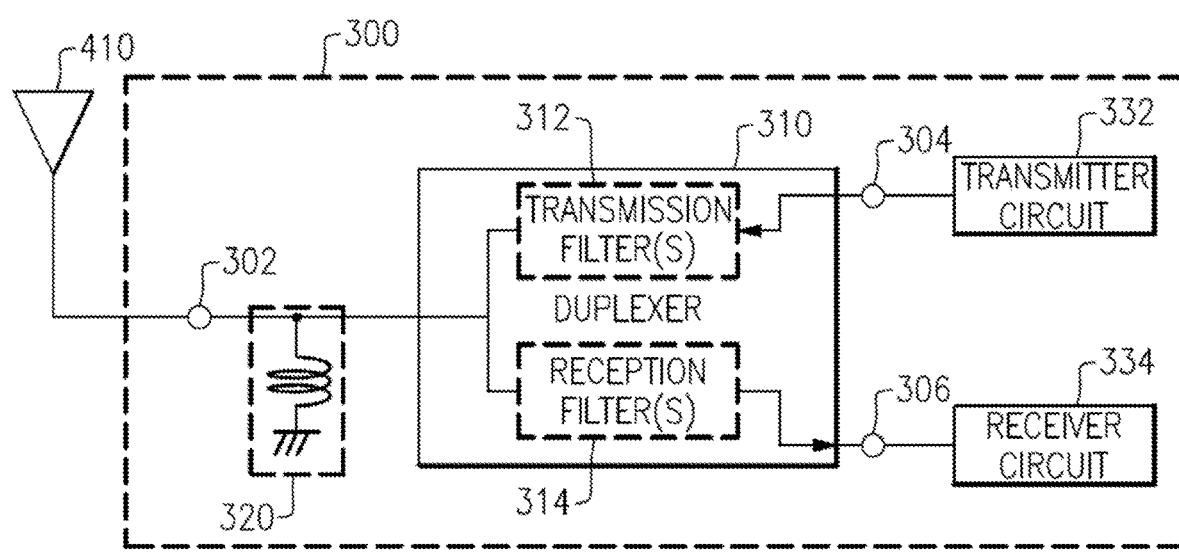
FIG. 7 is a schematic diagram of a radio frequency module that includes filters with SAW devices according to an embodiment.

Referring to FIG. 7, there is illustrated a block diagram of one example of a front-end module 300, which may be used in an electronic device such as a wireless communications device (e.g., a mobile phone) for example. The front-end module 300 includes an antenna duplexer 310 having a common node 302, an input node 304, and an output node 306. An antenna 410 is connected to the common node 302.

The antenna duplexer 310 may include one or more transmission filters 312 connected between the input node 304 and the common node 302, and one or more reception filters 314 connected between the common node 302 and the output node 306. The passband(s) of the transmission filter(s) are different from the passband(s) of the reception filters. Examples of the SAW filter 204 can be used to form the transmission filter(s) 312 and/or the reception filter(s) 314. An inductor or other matching component 320 may be connected at the common node 302.

The front-end module 300 further includes a transmitter circuit 332 connected to the input node 304 of the duplexer 310 and a receiver circuit 334 connected to the output node 306 of the duplexer 310. The transmitter circuit 332 can generate signals for transmission via the antenna 410, and the receiver circuit 334 can receive and process signals received via the antenna 410. In some embodiments, the receiver and transmitter circuits are implemented as separate components, as shown in FIG. 7. However, in other embodiments, these components may be integrated into a common transceiver circuit or module. As will be appreciated by those skilled in the art, the front-end module 300 may include other components that are not illustrated in FIG. 7 including, but not limited to, switches, electromagnetic couplers, amplifiers, processors, and the like.

Figure 8:
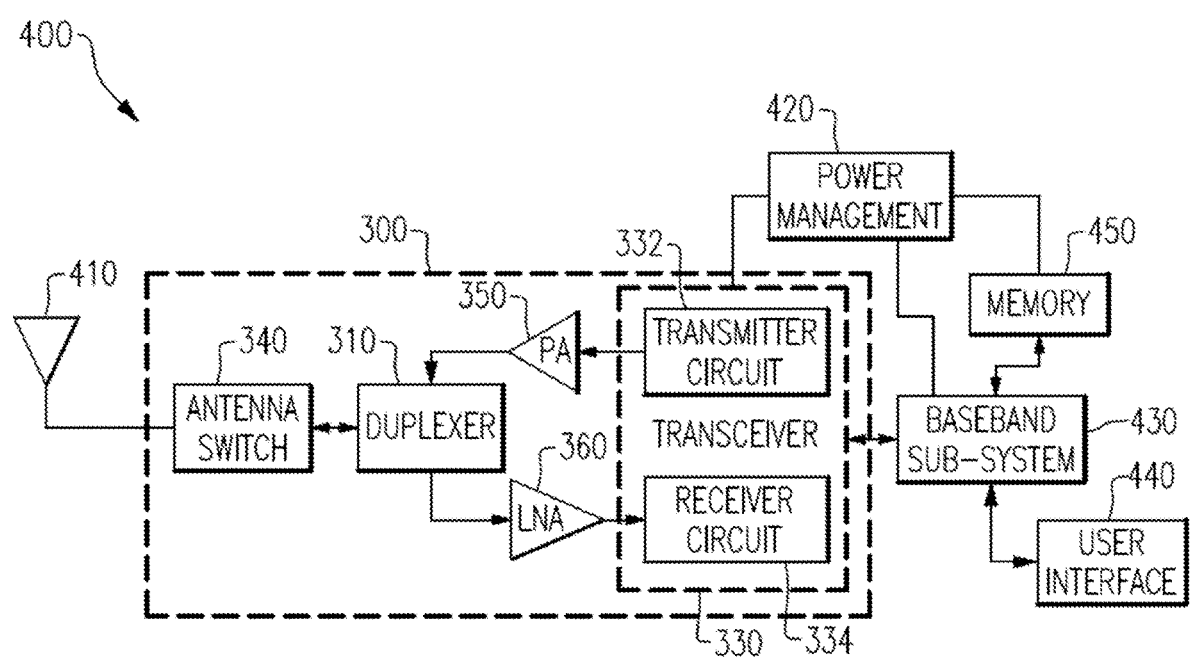
FIG. 8 is a schematic diagram of a wireless communication device that includes a filter with SAW devices according to an embodiment.

FIG. 8 is a block diagram of one example of a wireless device 400 including the antenna duplexer 310 shown in FIG. 7. The wireless device 400 can be a cellular phone, smart phone, tablet, modem, communication network or any other portable or non-portable device configured for voice or data communication. The wireless device 400 can receive and transmit signals from the antenna 410. The wireless device includes an embodiment of a front-end module 300 similar to that discussed above with reference to FIG. 7. The front-end module 300 includes the duplexer 310, as discussed above. In the example shown in FIG. 8 the front-end module 300 further includes an antenna switch 340, which can be configured to switch between different frequency bands or modes, such as transmit and receive modes, for example. In the example illustrated in FIG. 8, the antenna switch 340 is positioned between the duplexer 310 and the antenna 410. However, in other examples the duplexer 310 can be positioned between the antenna switch 340 and the antenna 410. In other examples, the antenna switch 340 and the duplexer 310 can be integrated into a single component.

The front-end module 300 includes a transceiver 330 that is configured to generate signals for transmission or to process received signals. The transceiver 330 can include the transmitter circuit 332, which can be connected to the input node 304 of the duplexer 310, and the receiver circuit 334, which can be connected to the output node 306 of the duplexer 310, as shown in the example of FIG. 7.

Signals generated for transmission by the transmitter circuit 332 are received by a power amplifier (PA) module 350, which amplifies the generated signals from the transceiver 330. The power amplifier module 350 can include one or more power amplifiers. The power amplifier module 350 can be used to amplify a wide variety of RF or other frequency-band transmission signals. For example, the power amplifier module 350 can receive an enable signal that can be used to pulse the output of the power amplifier to aid in transmitting a wireless local area network (WLAN) signal or any other suitable pulsed signal. The power amplifier module 350 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 350 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 8, the front-end module 300 may further include a low noise amplifier (LNA) module 360, which amplifies received signals from the antenna 410 and provides the amplified signals to the receiver circuit 334 of the transceiver 330.

The wireless device 400 of FIG. 8 further includes a power management sub-system 420 that is connected to the transceiver 330 and manages the power for the operation of the wireless device 400. The power management system 420 can also control the operation of a baseband sub-system 430 and various other components of the wireless device 400. The power management system 420 can include, or can be connected to, a battery (not shown) that supplies power for the various components of the wireless device 400. The power management system 420 can further include one or more processors or controllers that can control the transmission of signals, for example. In one embodiment, the baseband sub-system 430 is connected to a user interface 440 to facilitate various input and output of voice and/or data provided to and received from the user. The baseband sub-system 1030 can also be connected to memory 450 that is configured to store data and/or instructions to facilitate the operation of the wireless device, and/or to provide storage of information for the user.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 500 MHz to 3 GHz.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

For the purpose of description, it will be understood that a module can be a physical module and/or a functional block configured to provide a desired modular functionality with one or more devices and/or circuits. For example, a physical module can be a packaged module implemented on a packaging substrate, a packaged die configured to be mounted on a circuit board, or any other physical device configured to provide RF functionality. It will also be understood that a module can include one or more physical devices, including a plurality of physical devices with each sometimes being referred to as a module itself.

Also for the purpose of description, it will be understood that a component can be physical device and/or an assembly of one or more devices and/or circuits configured to provide a functionality. In some situations, a component can also be referred to as a module, and vice versa.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A surface acoustic wave device comprising:
   a piezoelectric layer forming a plane with a propagation axis;
   a plurality of slanted interdigital transducer electrodes arranged on the piezoelectric layer in ranks that are not aligned with the propagation axis;
   arranged on the piezoelectric layer in the same plane, at least one non-slanted surface acoustic wave filter having an elongate axis that parallels the propagation axis; and
   arranged on the piezoelectric layer in the same plane, at least one trapezoid interdigital transducer electrode having one side aligned with the propagation axis and one side aligned with the ranks of slanted interdigital transducer electrodes.

2. The surface acoustic wave device of claim 1 wherein the at least one trapezoid interdigital transducer electrode includes a first bus bar having first fingers extending from the first bus bar and a second bus bar having second fingers extending from the second bus bar, the first and second bus bars being non-parallel to each other.

3. The surface acoustic wave device of claim 2 wherein the first bus bar and first fingers are perpendicular to each other, and the second bus bar and second fingers are non-perpendicular to each other.

4. The surface acoustic wave device of claim 3 further comprising a plurality of trapezoid interdigital transducer electrodes over the piezoelectric layer.

5. The surface acoustic wave device of claim 4 wherein the plurality of slanted interdigital transducer electrodes and the plurality of trapezoidal interdigital transducer electrodes are arranged in a tessellating pattern.

6. The surface acoustic wave device of claim 4 wherein the non-slanted surface acoustic wave filter is a multi-mode surface acoustic wave filter having an elongate rectangular shape.

7. The surface acoustic wave device of claim 6 wherein the multi-mode surface acoustic wave filter is arranged such that the sides of the multi-mode surface acoustic wave filter are parallel to peripheral edges of the surface acoustic wave device.

8. The surface acoustic wave device of claim 6 wherein the plurality of slanted interdigital transducer electrodes, the plurality of trapezoidal interdigital transducer electrodes and the multi-mode surface acoustic wave filter are arranged in a tessellating pattern.

9. The surface acoustic wave device of claim 4 wherein at least one of the plurality of trapezoid interdigital transducer electrodes includes a first bus bar having fingers extending perpendicularly from the first bus bar, the first bus bar being arranged adjacent to a peripheral edge of the surface acoustic wave device.

10. The surface acoustic wave device of claim 7 wherein at least one of the plurality of trapezoid interdigital transducer electrodes includes a first bus bar having fingers extending perpendicularly from the first bus bar, the first bus bar being arranged adjacent to a side of the multi-mode surface acoustic wave filter.

11. The surface acoustic wave device of claim 1 further comprising a support substrate, the piezoelectric layer being disposed between the support substrate and the interdigital transducer electrode.

12. The surface acoustic wave device of claim 11 further comprising a low velocity layer disposed between the support substrate and the piezoelectric layer, the low velocity layer having an acoustic velocity lower than an acoustic velocity of the piezoelectric layer.

13. The surface acoustic wave device of claim 12 wherein the low velocity layer is a silicon dioxide layer and the piezoelectric layer is a lithium tantalate layer.

14. A surface acoustic wave device comprising:
   a multilayer piezoelectric substrate including a support substrate and a piezoelectric layer over the support substrate, the piezoelectric layer forming a planar surface; and
   at least one trapezoid interdigital transducer electrode over the piezoelectric layer having a trapezoidal shape when viewed from above the planar surface and configured for positioning in a tessellating manner adjacent to but not in contact with slanted and non-slanted elements on the same planar surface.

15. The device of claim 14 further comprising a non-slanted element forming a surface acoustic wave filter device and a slanted element forming an interdigital transducer electrode, the two elements nonparallel to each other, and the at least one trapezoid interdigital transducer electrode occupies an opening on the planar surface between the two nonparallel elements.

16. A surface acoustic wave filter comprising:

a piezoelectric layer having a straight edge;

an array of slanted elements forming at least one rank on the piezoelectric layer that is slanted with respect to the straight edge;

at least one parallel element on the piezoelectric layer having an elongate axis that is parallel to the straight edge; and at least one interdigital transducer electrode over the piezoelectric layer, the at least one interdigital transducer electrode being a trapezoid interdigital transducer electrode and having at least one side parallel to the straight edge and one side parallel to the at least one slanted rank such that the trapezoid interdigital transducer electrode efficiently fills space on the piezoelectric layer between the array and the parallel element.

17. The surface acoustic wave filter of claim 16 wherein the array of slanted elements includes a plurality of slanted interdigital transducer electrodes and the at least one parallel element includes a multi-mode surface acoustic wave filter.

18. The surface acoustic wave filter of claim 16 wherein the array of slanted elements and the trapezoid interdigital transducer electrode are all configured to suppress transverse modes while filtering acoustic signals.

19. The surface acoustic wave filter of claim 16 further comprising a plurality of trapezoidal interdigital transducer electrodes and a plurality of slanted interdigital transducer electrodes over the piezoelectric layer, the plurality of slanted interdigital transducer electrodes and the plurality of trapezoidal interdigital transducer electrodes arranged in a tessellating pattern such that any open spaces are occupied by at least one of the electrodes.

20. A radio frequency module comprising:

a power amplifier configured to provide a radio frequency signal; and a surface acoustic wave filter configured to filter the radio frequency signal, the surface acoustic wave filter including a piezoelectric layer, an array of elements over the piezoelectric layer having trapezoidal voids therebetween, and at least one trapezoidal interdigital transducer electrode over the piezoelectric layer configured to efficiently occupy at least one of the trapezoidal voids.

21. A wireless communication device comprising the radio frequency module of claim 20, wherein the surface acoustic wave filter is further configured to suppress transverse modes.

* * * * *